United States Patent
Wu et al.

(10) Patent No.: US 10,504,945 B2
(45) Date of Patent: Dec. 10, 2019

(54) ARRAY SUBSTRATE AND METHOD FOR MANUFACTURING THE SAME, DISPLAY APPARATUS

(71) Applicants: BOE TECHNOLOGY GROUP CO., LTD., Beijing (CN); CHONGQING BOE OPTOELECTRONICS TECHNOLOGY CO., LTD., Chongqing (CN)

(72) Inventors: Xu Wu, Beijing (CN); Rong Wu, Beijing (CN); Chao Zhang, Beijing (CN); Zhonghao Huang, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 16/086,278

(22) PCT Filed: Feb. 7, 2018

(86) PCT No.: PCT/CN2018/075622
§ 371 (c)(1),
(2) Date: Sep. 18, 2018

(87) PCT Pub. No.: WO2018/201770
PCT Pub. Date: Nov. 8, 2018

(65) Prior Publication Data
US 2019/0115374 A1  Apr. 18, 2019

(30) Foreign Application Priority Data
May 3, 2017 (CN) .......................... 2017 1 0304985

(51) Int. Cl.
*H01L 21/00* (2006.01)
*H01L 27/12* (2006.01)
(Continued)

(52) U.S. Cl.
CPC ........ *H01L 27/1288* (2013.01); *G02F 1/1362* (2013.01); *G02F 1/1368* (2013.01);
(Continued)

(58) Field of Classification Search
CPC ............. H01L 27/1288; H01L 27/1259; H01L 29/42384
See application file for complete search history.

(56) References Cited

U.S. PATENT DOCUMENTS 9,466,624 B2 * 10/2016 Guo ..................... H01L 27/1288
9,812,472 B2 * 11/2017 Yao ..................... H01L 27/1225
(Continued)

FOREIGN PATENT DOCUMENTS

| CN | 102629584 A | 8/2012 |
| CN | 102651341 A | 8/2012 |

(Continued)

OTHER PUBLICATIONS

International Search Report and Written Opinion issued in International Patent Application No. PCT/CN2018/075622, dated May 8, 2018; with English translation.
(Continued)

*Primary Examiner* — Laura M Menz
(74) *Attorney, Agent, or Firm* — McDermott Will & Emery LLP

(57) ABSTRACT

A method for manufacturing an array substrate includes: forming a metal-oxide semiconductor layer, a first conductive layer and a second conductive layer sequentially on a substrate; and treating the metal-oxide semiconductor layer, the first conductive layer and the second conductive layer in
(Continued)

a single patterning process using a mask, to form an active layer, pixel electrodes, a source drain pattern layer which includes source electrodes, drain electrodes and data lines, and a reserved pattern of the first conductive layer which is provided in a same layer as the pixel electrodes and formed on sides of the source electrodes and the data lines close to the active layer. The drain electrode is in direct contact with the pixel electrode, and a partial region of the pixel electrode is unobstructed from the drain electrode.

11 Claims, 3 Drawing Sheets

(51) Int. Cl.
H01L 29/786 (2006.01)
G02F 1/1368 (2006.01)
G02F 1/1343 (2006.01)
G02F 1/1362 (2006.01)
H01L 29/66 (2006.01)
H01L 29/417 (2006.01)
H01L 29/423 (2006.01)

(52) U.S. Cl.
CPC ........ *G02F 1/13439* (2013.01); *H01L 27/124* (2013.01); *H01L 27/127* (2013.01); *H01L 27/1225* (2013.01); *H01L 27/1259* (2013.01); *H01L 29/41733* (2013.01); *H01L 29/42384* (2013.01); *H01L 29/66969* (2013.01); *H01L 29/7869* (2013.01); *G02F 1/134363* (2013.01); *G02F 2001/13685* (2013.01); *G02F 2001/136236* (2013.01)

(56) References Cited

U.S. PATENT DOCUMENTS

| | | | | |
|---|---|---|---|---|
| 9,893,098 B2* | 2/2018 | Guo | | H01L 27/1288 |
| 9,893,206 B2* | 2/2018 | Wang | | H01L 29/78696 |
| 2008/0001154 A1* | 1/2008 | Lee | | H01L 27/1214 |
| | | | | 257/59 |
| 2008/0035917 A1* | 2/2008 | Choi | | G02F 1/136286 |
| | | | | 257/40 |
| 2009/0267087 A1* | 10/2009 | Yang | | G02F 1/136286 |
| | | | | 257/88 |
| 2013/0302939 A1 | 11/2013 | Liu et al. | | |
| 2016/0043117 A1* | 2/2016 | Guo | | H01L 27/1288 |
| | | | | 438/158 |
| 2016/0141425 A1* | 5/2016 | Sun | | H01L 27/124 |
| | | | | 257/72 |
| 2016/0181278 A1* | 6/2016 | Choi | | H01L 29/458 |
| | | | | 257/72 |
| 2016/0351726 A1* | 12/2016 | Wang | | H01L 29/78696 |
| 2017/0025450 A1* | 1/2017 | Guo | | H01L 27/1288 |
| 2017/0162612 A1* | 6/2017 | Yao | | H01L 27/1225 |
| 2018/0294292 A1* | 10/2018 | Zhou | | H01L 27/1288 |
| 2019/0115374 A1* | 4/2019 | Wu | | H01L 29/41733 |

FOREIGN PATENT DOCUMENTS

| | | |
|---|---|---|
| CN | 102651343 A | 8/2012 |
| CN | 103022055 A | 4/2013 |
| CN | 107093583 A | 8/2017 |

OTHER PUBLICATIONS

First Office Action issued in Chinese Patent Application No. 201710304985.0, dated Sep. 4, 2018, with English translation.

* cited by examiner

ARRAY SUBSTRATE AND METHOD FOR MANUFACTURING THE SAME, DISPLAY APPARATUS

CROSS-REFERENCE TO RELATED APPLICATION

This application is a national phase entry under 35 USC 371 of International Patent Application No. PCT/CN2018/075622 filed on Feb. 7, 2018, which claims priority to Chinese Patent Application No. 201710304985.0, submitted to the Chinese patent office on May 3, 2017, titled "AN ARRAY SUBSTRATE AND METHOD FOR MANUFACTURING THE SAME, DISPLAY APPARATUS", which are incorporated herein by reference in their entirety.

TECHNICAL FIELD

The present disclosure relates to the technical field of display, and more particularly to an array substrate and a method for manufacturing the same, and a display apparatus.

BACKGROUND

Liquid crystal display devices are widely used owing to their various advantages such as a thin body, power saving, and zero radiation. The working principle of a liquid crystal panel is to encapsulate liquid crystal molecules between two paired substrates, and apply driving voltages to the two substrates to control the rotation directions of the liquid crystal molecules, thereby refracting the light of the backlight to display the screen. The two paired substrates in the liquid crystal panel are a thin film transistor array substrate (usually referred to simply as an array substrate) and a color filter substrate (usually referred to simply as a color film substrate), respectively. The array substrate includes basic structures such as gate lines, gate electrodes, a gate insulating layer, an active layer that is made of a semiconductor material, data lines, source electrodes, drain electrodes, an insulating layer, and pixel electrodes. Gate electrodes, source electrodes, drain electrodes and the active layer constitute thin film transistors (TFTs). Conventional TFTs are usually amorphous silicon TFTs (i.e. the active layer is made of an amorphous silicon material) and low temperature polysilicon TFTs (i.e. the active layer is made of a low temperature polysilicon material). The array substrate including the amorphous silicon TFTs usually requires 3-5 times of photolithographic mask process, and thus has low cost and vigorous competitiveness. The array substrate including the low temperature polysilicon TFTs usually requires 8-9 times of photolithographic mask process, and thus has higher cost.

However, the carrier mobility of the amorphous silicon TFTs is low, which is difficult to meet the requirement of a large-size display panel for a pixel-driven response rate. Therefore, currently the metal-oxide semiconductor (such as Indium Gallium Zinc Oxide (IGZO)) is usually used as a material of the active layer. Since the carrier mobility of the metal-oxide semiconductor is 20 to 30 times of that of the amorphous silicon, the charge and discharge rates of the TFTs to the pixel electrodes may be greatly improved, and thus the response speed of the pixels may be improved, thereby achieving a faster refresh rate. Meanwhile, the line scan rate of pixels is also greatly improved owing to a faster response, which makes an ultra-high resolution possible in a liquid crystal display apparatus.

SUMMARY

In a first aspect, some embodiments of the present disclosure provide a method for manufacturing an array substrate, and the method includes: forming a metal-oxide semiconductor layer, a first conductive layer and a second conductive layer sequentially on a substrate; and treating the metal-oxide semiconductor layer, the first conductive layer and the second conductive layer in a single patterning process using a mask, to form an active layer, pixel electrodes, a source drain pattern layer which includes source electrodes, drain electrodes and data lines, and a reserved pattern of the first conductive layer which is provided in a same layer as the pixel electrodes and formed on sides of the source electrodes and the data lines close to the active layer. A drain electrode of the drain electrodes is in direct contact with a corresponding pixel electrode of the pixel electrodes, and a partial region of the pixel electrode is unobstructed from the drain electrode.

Optionally, the mask includes totally transparent portions, opaque portions, first transmittance exposure portions and second transmittance exposure portions. The transmittances of the first transmittance exposure portions and the second transmittance exposure portions are different, and both are less than a transmittance of the totally transparent portions. During the patterning process for treating the metal-oxide semiconductor layer, the first conductive layer and the second conductive layer, one of the first transmittance exposure portions corresponds to a region of an active layer to be formed corresponding to a region between a source electrode and a drain electrode in the source drain pattern layer, and one of the second transmittance exposure portions corresponds to a partial region of a pixel electrode to be formed unobstructed from a corresponding drain electrode in the source drain pattern layer.

Optionally, treating the metal-oxide semiconductor layer, the first conductive layer and the second conductive layer in the single patterning process using the mask to form the active layer, the pixel electrodes, and the source drain pattern layer, includes, forming a photoresist layer covering the second conductive layer; performing a treatment including exposure and development for the photoresist layer via the mask, to form first photoresist reserved portions, second photoresist reserved portions, third photoresist reserved portions and photoresist complete removal regions, wherein thicknesses of each first photoresist reserved portion, each second photoresist reserved portion and each third photoresist reserved portion are successively decreased, the first photoresist reserved portions correspond to a source drain pattern layer to be formed, one of the second photoresist reserved portions corresponds to the partial region of the pixel electrode to be formed unobstructed from the drain electrode in the source drain pattern layer, one of the third photoresist reserved portions corresponds to the region of the active layer to be formed corresponding to the region between the source electrode and the drain electrode in the source drain pattern layer, and the photoresist complete removal regions correspond to remaining regions of the second conductive layer; removing portions of the second conductive layer corresponding to the photoresist complete removal regions, and portions of the first conductive layer and portions of the metal-oxide semiconductor layer which are under the portions of the second conductive layer corresponding to the photoresist complete removal regions; sequentially removing the third photoresist reserved portions, portions of the second conductive layer corresponding to the third photoresist reserved portions, and portions of the first conductive layer the portions of the second conductive layer corresponding to the third photoresist reserved portions, to form an active layer, a reserved pattern of the first conductive layer that is located on the active layer, and pixel electrodes, source electrodes and data lines that are provided in a same layer as the reserved pattern of the first conductive layer; sequentially removing the second photoresist reserved portions and portions of the second conductive layer corresponding to the second photoresist reserved portions to form drain electrodes; and removing the first photoresist reserved portions to expose the source drain pattern layer, the pixel electrodes and regions of the active layer corresponding to regions each of which is located between the source electrode and the drain electrode.

Optionally, the photoresist layer is made of a positive photoresist material. A transmittance of the first transmittance exposure portions is larger than that of the second transmittance exposure portions. One of the totally transparent portions corresponds to a photoresist complete removal region to be formed, one of the opaque portions corresponds to a first photoresist reserved portion to be formed, one of the first transmittance exposure portions corresponds to a third photoresist reserved portion to be formed, and one of the second transmittance exposure portions corresponds to a second photoresist reserved portion to be formed.

Optionally, the photoresist layer is made of a negative photoresist material, and a transmittance of the first transmittance exposure portions is less than that of the second transmittance exposure portions. One of the totally transparent portions corresponds to a first photoresist reserved portion to be formed, one of the opaque portions corresponds to a photoresist complete removal region to be formed, one of the first transmittance exposure portions corresponds to a third photoresist reserved portion to be formed, and one of the second transmittance exposure portion corresponds to a second photoresist reserved portion to be formed.

Optionally, the method further includes: forming a gate insulating layer which covers the active layer, the pixel electrodes and the source drain pattern layer; and forming a gate metal pattern layer on the gate insulating layer. The gate metal pattern layer includes gate electrodes and gate lines.

Optionally, the first conductive layer is a transparent conductive material layer.

Optionally, the second conductive layer is a metal layer.

In a second aspect, some embodiments of the present disclosure provide an array substrate, and the array substrate includes a substrate. The array substrate further includes: an active layer disposed on the substrate, wherein the active layer is made of a metal-oxide semiconductor; a reserved pattern of a first conductive layer and pixel electrodes, wherein the reserved pattern and the pixel electrodes are disposed on the active layer; and a source drain pattern layer disposed above the active layer. The source drain pattern layer includes source electrodes, drain electrodes and data lines. The source electrodes and the data lines cover the reserved pattern of the first conductive layer, and one of the drain electrodes covers a partial region of a corresponding one of the pixel electrodes.

Optionally, the array substrate further includes a gate insulating layer covering the active layer, the pixel electrodes, the source drain pattern layer, and a gate metal pattern layer which is disposed on the gate insulating layer. The gate metal pattern layer includes gate electrodes and gate lines.

In a third aspect, some embodiments of the present disclosure further provide a display apparatus, including the aforementioned array substrate.

BRIEF DESCRIPTION OF THE DRAWINGS

In order to describe technical solutions in embodiments of the present disclosure more clearly, the accompanying drawings to be used in the description of embodiments will be introduced briefly. Obviously, the accompanying drawings to be described below are merely some embodiments of the present disclosure, and a person of ordinary skill in the art can obtain other drawings according to those drawings without paying any creative effort.

DETAILED DESCRIPTION

Figure 1:
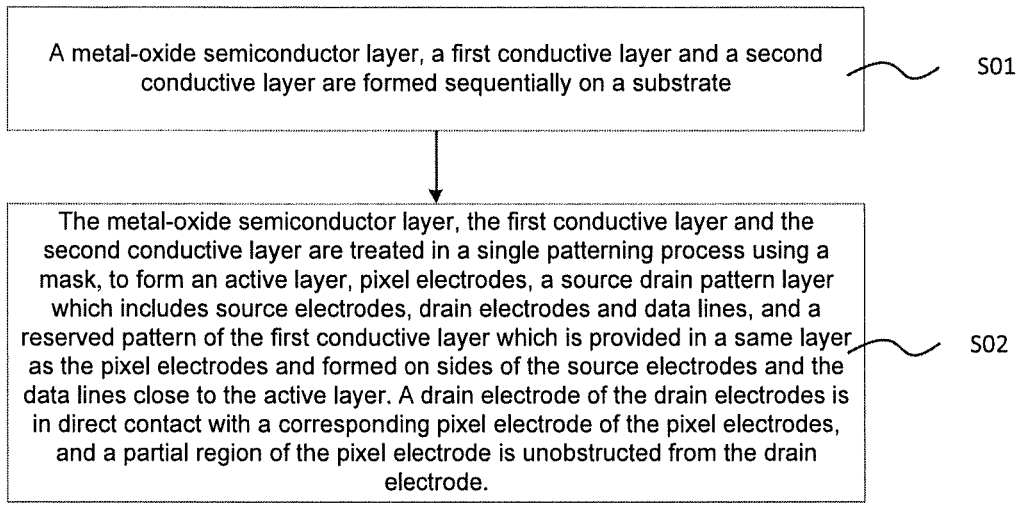
FIG. 1 is a first flow diagram of a method for manufacturing an array substrate provided in some embodiments of the present disclosure.

The technical solutions in the embodiments of the present disclosure will be described clearly and completely with reference to the accompanying drawings in the embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

It will be noted that all terms (including technical and scientific terms) used in the embodiments of the present disclosure have the same meanings as commonly understood by those skilled in the art unless otherwise defined. It will also be understood that, the terms, such as those defined in ordinary dictionaries, should be interpreted as having meanings consistent with those in the context of the related art, but are not to be interpreted in an ideal or extremely formalized sense unless explicitly defined herein.

For example, the terms "first", "second" and similar terms used in the description and claims of the present disclosure do not denote any order, quantity or importance, but are merely used to distinguish different components. The word "include" or "comprise" or similar words mean that the element(s) or article(s) that appear before the words include the listed elements or articles and their equivalents that appear after the words, but do not exclude other elements or articles. The terms such as "one side" and "another side" indicating orientation or positional relationship are based on the orientation or positional relationship shown in the drawings. They are merely simplified descriptions for conveniently describing the technical solution of the present disclosure, not indicating or implying that the apparatus or the element referred to must have a specific orientation, or be constructed and operated in a particular orientation, and thus should not be construed as limiting the present disclosure.

As shown in FIG. 1, some embodiments of the present disclosure provide a method for manufacturing an array substrate, and the method includes the following steps.

In step 01 (S01), a metal-oxide semiconductor layer, a first conductive layer and a second conductive layer are formed sequentially on a substrate.

In step 02 (S02), the metal-oxide semiconductor layer, the first conductive layer and the second conductive layer are treated in a single patterning process using a mask, to form an active layer, pixel electrodes, a source drain pattern layer which includes source electrodes, drain electrodes and data lines, and a reserved pattern of the first conductive layer which is provided in a same layer as the pixel electrodes and formed on sides of the source electrodes and the data lines close to the active layer. A drain electrode of the drain electrodes is in direct contact with a corresponding pixel electrode of the pixel electrodes, and a partial region of the pixel electrode is unobstructed from the drain electrode.

It will be noted that firstly, in some embodiments of the present disclosure, the drain electrode of the TFT is electrically connected with the pixel electrode in a way of direct contact and the source electrode is connected with the data line, which is taken as an example for explanation. However, those skilled in the art should understand that due to the interchangeability between the source electrode and the drain electrode of the TFT in structure and composition, the source electrode of the TFT may be set to be in direct contact with the pixel electrode, and the drain electrode is connected to the data line, which is an equivalent transformation of the aforementioned embodiments of the present disclosure.

In some embodiments of the present disclosure, the conductive material of which the drain electrode is made is usually a metal material, and thus the transmittance of the drain electrode is low. Therefore, only a partial region of the pixel electrode is in direct contact with the drain electrode, and the remaining region of the pixel electrode is unobstructed from the drain electrode, so as to ensure that each of the display units of the array substrate has a sufficient opening area for display.

Secondly, in the aforementioned manufacturing method provided in the embodiments of the present disclosure, the so-called "patterning process" refers to a process that a film layer (constituted by one or more thin films) is treated to form a specific pattern by performing processes including exposure and development of the photoresist, film layer etching, and removal of the photoresist by using a mask once.

In addition, the so-called "provided in a same layer" involves at least two kinds of patterns, and refers to a structure in which at least two kinds of patterns are arranged in a same thin film. Specifically, it refers to that at least two kinds of patterns are formed from a thin film made of the same material in a single patterning process.

That is, in the embodiments of the present disclosure, the two kinds of patterns refer to the aforementioned pixel electrode and the reserved pattern of the first conductive layer both arranged on the active layer.

Thirdly, since the basic components of the TFT further include a gate electrode, the method for manufacturing the array substrate further includes a step of forming gate electrodes.

In some embodiments of the present disclosure, regarding the case that the TFT to be formed is of a bottom gate type (i.e. the gate electrode is located on a side of the active layer close to a base substrate), the aforementioned array substrate includes a base substrate, and a gate metal pattern layer and a gate insulating layer that are formed on the base substrate. That is, before the step 01, the method further includes a step of sequentially forming, on the base substrate, the gate metal pattern layer (the gate metal pattern layer includes the gate electrodes and the gate lines) and the gate insulating layer covering the gate metal pattern layer.

In some other embodiments of the present disclosure, regarding the case that the TFT to be formed is of a top gate type (i.e. the gate electrode is located on another side of the active layer away from the base substrate), after the step 02, the method further includes steps of forming a gate insulating layer covering the active layer, the pixel electrodes and the source drain pattern layer, and forming a gate metal pattern layer (the gate metal pattern includes the gate electrodes and the gate lines) on the gate insulating layer.

Based on this, through the aforementioned manufacturing method provided in the embodiments of the present disclosure, since the metal-oxide semiconductor is used as a material of the active layer, and the material of the active layer and the material (usually indium tin oxide (ITO), etc.) of the first conductive layer used as the pixel electrode are both oxide semiconductor and have the similar structure, the active layer, the pixel electrodes, the source electrodes, the drain electrodes and the data lines can be formed in a single patterning process by adjusting the order of the etching process using a same mask, thereby significantly simplifying the preparation process of the array substrate.

Particularly, when the aforementioned array substrate is a TFT array substrate of the top gate type, the gate electrodes can be formed in only a single patterning process after the aforementioned active layer, the pixel electrodes, the source electrodes, the drain electrodes and the data lines are formed. Consequently, the TFT array substrate can be formed through merely two times of mask processes, which greatly decreases the steps for manufacturing the metal-oxide semiconductor TFT array substrate, shortens the processing time, and thus effectively reduces the production cost, and increases the production capacity of the metal-oxide semiconductor TFT array substrate.

In addition, the reserved pattern of the first conductive layer formed when the pixel electrode is formed is retained under the source electrodes and the data lines, and a portion of the reserved pattern of the first conductive layer is in direct contact with one of the data line, which is equivalent to that the portion of the reserved pattern of the first conductive layer and the data line are connected in parallel. Therefore, the resistance of the data line may be reduced and the energy consumption of the array substrate may be lowered. In addition, the direct contact between a portion of reserved pattern of the first conductive layer and one of the source electrodes may improve the electrical property between the source electrode and the active layer, thereby further improving the characteristics of the TFT.

Furthermore, based on the above, the aforementioned mask provided in the embodiments of the present disclosure is a gray tone or halftone mask having four different transmittances. The mask includes totally transparent portions, opaque portions, first transmittance exposure portions and second transmittance exposure portions. The transmittances of the first transmittance exposure portions and the second transmittance exposure portions are different, and both less than that of the totally transparent portions. During the patterning process of the metal-oxide semiconductor layer, the first conductive layer and the second conductive layer, one of the first transmittance exposure portions corresponds to a region of an active layer to be formed corresponding to a region between a source electrode and a drain electrode in the source drain pattern layer, and one of the second transmittance exposure portions corresponds to a partial region of a pixel electrode to be formed unobstructed from the drain electrode in a corresponding source drain pattern layer. Therefore, the aforementioned patterns may be formed by performing a single patterning process on the metal-oxide semiconductor layer, the first conductive layer and the second conductive layer using a mask merely once.

Further, it can been seen from the above description that, since the gate electrode of the bottom gate TFT is located under the active layer, and a common electrode formed in a same layer as the gate electrode has a wire lead that is provided under the gate insulating layer, an additional communication process is needed to form a via hole in the gate insulating layer so that the common electrode is electrically connected to its lead. In contrast, since the gate electrode of the TFT of the top gate type is located above the active layer, and the wire lead of the common electrode formed in the same layer as the gate electrode is directly formed on the gate insulating layer, no additional communication process is needed for the gate insulating layer, which may further significantly reduce the times of the patterning process of the array substrate. Therefore the embodiments of the present disclosure may adopt the aforementioned TFT structure of the top gate type.

Figure 2:
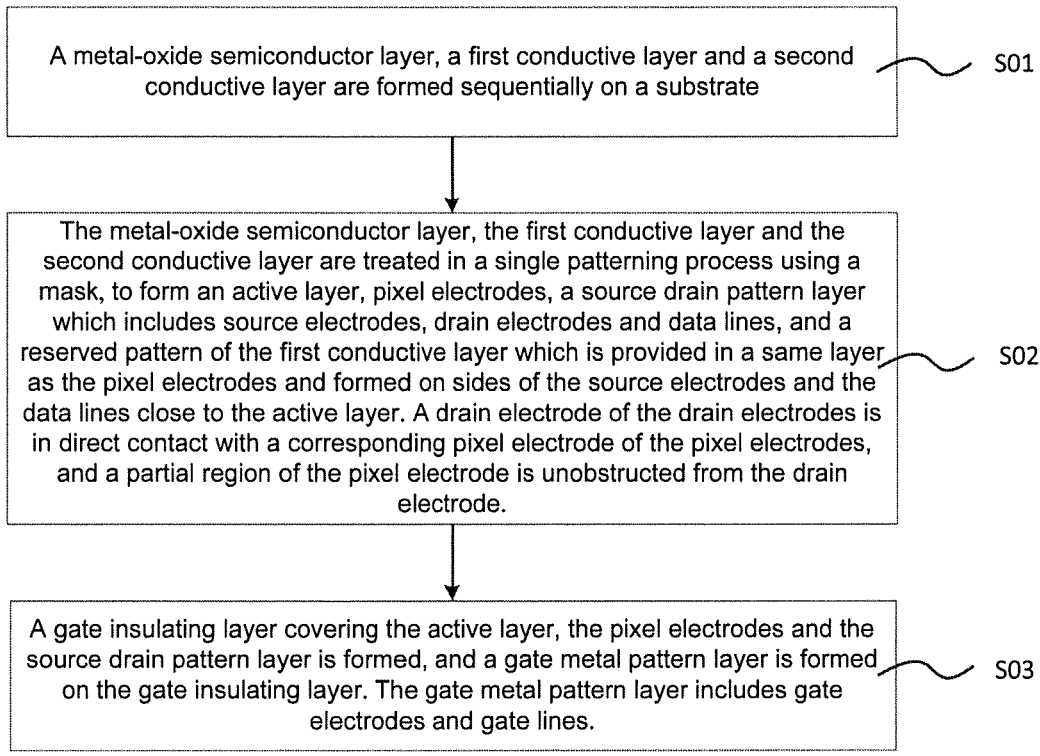
FIG. 2 is a second flow diagram of a method for manufacturing an array substrate provided in some embodiments of the present disclosure.

That is, after the step S02, as shown in FIG. 2, the manufacturing method further includes the following steps.

In S03, a gate insulating layer covering the active layer, the pixel electrodes and the source drain pattern layer is formed, and a gate metal pattern layer is formed on the gate insulating layer. The gate metal pattern layer includes gate electrodes and gate lines.

Here, the gate metal pattern layer can further include other metal wires made of a gate metal and formed in a same layer as gate lines, such as metal wires that provide a constant DC voltage and gate line leads that provide signals to the gate lines. Regarding the structures of other metal wires, the structures in the prior art can be adopted, which will not be elaborated in the embodiments of the present disclosure.

A TFT array substrate of a TN (Twist Nematic) display mode can be formed using the S01 to S03, but the embodiments of the present disclosure are not limited thereto. The method for manufacturing the above array substrate provided in some embodiments of the present disclosure can further include a step of forming a common electrode corresponding to the pixel electrodes on the gate insulating layer, so as to form a TFT array substrate of an ADS (Advanced Super Dimensional Switching) display mode. The S03 can include a step of forming a gate metal pattern layer and a common electrode on the gate insulating layer in a single patterning process using a halftone mask once.

Based on the above, some embodiments of the present disclosure provide an array substrate manufactured by the above manufacturing method, and the array substrate includes a substrate. The array substrate further includes: an active layer made of a metal-oxide semiconductor and disposed on the substrate; a reserved pattern of the first conductive layer and pixel electrodes disposed on the active layer; a source drain pattern layer disposed above the active layer. The source drain pattern layer includes source electrodes, drain electrodes and data lines. The source electrodes and the data lines cover the reserved pattern of the first conductive layer, and one of the drain electrodes covers a partial region of a corresponding one of the pixel electrodes.

In the above array substrate structure, the reserved pattern of the first conductive layer formed when the pixel electrodes are formed is still retained under the source electrodes and the data lines, and a portion of the reserved pattern of the first conductive layer is in direct contact with the data line, which is equivalent to that the portion of the reserved pattern of the first conductive layer and the data line are connected in parallel. Therefore, the resistance of the data line may be reduced and the energy consumption of the array substrate may be lowered. In addition, the direct contact between a portion of the reserved pattern of the first conductive layer and the source electrode may improve the electrical property between the source electrode and the active layer, thereby further improving the characteristics of the TFT.

Further, since the TFT structure of the top gate type may further reduce the times of mask patterning of the array substrate, in the embodiments of present disclosure, the aforementioned array substrate can be the TFT array substrate of the top gate type. The aforementioned array substrate further includes a gate insulating layer covering the active layer, the pixel electrodes and the source drain pattern layer, and a gate metal pattern layer disposed on the gate insulating layer. The gate metal pattern layer includes gate electrodes and gate lines.

Based on this, some embodiments of the present disclosure provide a display apparatus, and the display apparatus includes the aforementioned array substrate. The aforementioned display apparatus may be a product or component having any display function, such as a liquid crystal display, a liquid crystal television, an organic electroluminescence display, a digital photo frame, a mobile phone, a tablet computer, a digital photo frame, a navigator etc.

An embodiment is provided below to describe in detail the manufacturing process of the aforementioned TFT array substrate of the top gate type.

Figure 3:
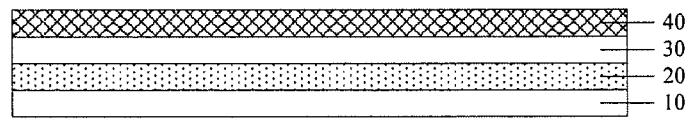
FIG. 3 is a schematic diagram of a first stepwise structure corresponding to a method for manufacturing an array substrate provided in some specific embodiments of the present disclosure.

In step 11 (S11), as shown in FIG. 3, a metal-oxide semiconductor layer 20, a first conductive layer 30 and a second conductive layer 40 are sequentially formed on a base substrate 10.

In some embodiments of the present disclosure, the metal-oxide semiconductor layer 20 is made of at least one material of indium gallium zinc oxide (IGZO), stannum-doped indium oxide ($Sn-In_2O_3$) and molybdenum-doped indium oxide ($Mo-In_2O_3$). The first conductive layer 30 is made of at least one material of ITO, indium zinc oxide (IZO) and fluorine-doped tin oxide (FTO). The second conductive layer 40 is made of a material with low resistance such as Cu, etc.

Figure 4:
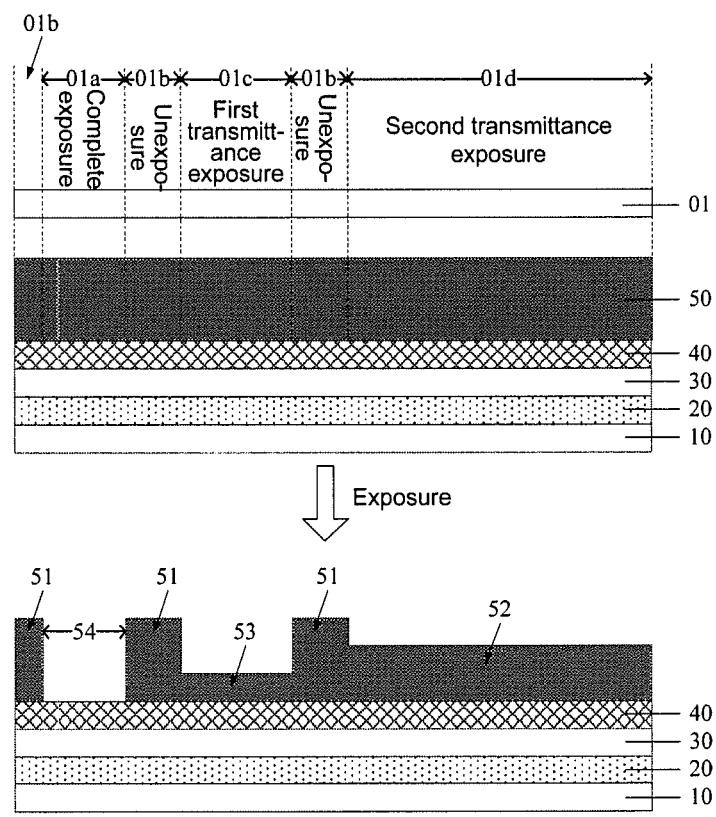
FIG. 4 is a schematic partial diagram of a second stepwise structure corresponding to a method for manufacturing an array substrate provided in some specific embodiments of the present disclosure.

In step 12 (S12), as shown in FIG. 4, a photoresist layer 50 covering the second conductive layer 40 is formed, and treatments including exposure and development are performed on the photoresist layer 50 via a mask 01, to form first photoresist reserved portions 51, second photoresist reserved portions 52, third photoresist reserved portions 53 and photoresist complete removal regions 54. Thicknesses of each first photoresist reserved portion 51, each second photoresist reserved portion 52 and each third photoresist reserved portion 54 are successively decreased. The first photoresist reserved portions 51 correspond to the source drain pattern layer to be formed. One of the second photoresist reserved portions 52 corresponds to the partial region of the pixel electrode to be formed unobstructed from the corresponding drain electrode in the source drain pattern layer. One of the third photoresist reserved portion 53 corresponds to the region of the active layer to be formed corresponding to a region between the source electrode and the drain electrode in the source drain pattern layer. The photoresist complete removal region 54 corresponds to remaining regions of the second conductive layer 40.

Here, in the S12, a specific mask type corresponding to the exposure and development characteristics of photoresist (PR) is selected to form the aforementioned three PR patterns with different thicknesses.

Referring to FIG. 4, the embodiments of the present disclosure is specifically described by taking the formed photoresist layer being made of a positive photoresist material as an example. The positive photoresist material has the characteristic that it cannot be dissolved in a developer before exposure, but can be dissolved in the developer after being exposed under ultraviolet light, and thereby can be removed Correspondingly, referring to FIG. 4 continually, the aforementioned mask 01 specifically includes totally transparent portions 01a, opaque portions 01b, first transmittance exposure portions 01c and second transmittance exposure portions 01d. A transmittance of the first transmittance exposure portions 01c is larger than that of the second transmittance exposure portions 01d. One of the totally transparent portion 01a corresponds to a photoresist complete removal region to be formed 54, one of the opaque portions 01b corresponds to a first photoresist reserved portion to be formed 51, one of the first transmittance exposure portions 01c corresponds to a third photoresist reserved portion to be formed 53, and one of the second transmittance exposure portions 01d corresponds to a second photoresist reserved portion to be formed 52.

The aforementioned three PR patterns with different thicknesses are formed by a gray-tone mask or a half-tone mask with the above two partial transmittances.

Of course, in the above embodiments, a negative photoresist material having characteristics opposite to the positive photoresist material can be selected. The negative photoresist material has the characteristic that it can be dissolved in a developer before exposure, but cannot be dissolved in the developer after being exposed under ultraviolet light; thereby, the unexposed portions can be removed.

When the formed photoresist layer is made of a negative photoresist material, the mask includes totally transparent portions, opaque portions, first transmittance exposure portions and second transmittance exposure portions. The transmittance of the first transmittance exposure portions of the mask corresponding to the negative photoresist material is less than that of the second transmittance exposure portions, which is opposite to the transmittance of the mask corresponding to the positive photoresist material. One of the totally transparent portions corresponds to the first photoresist reserved portion to be formed. One of the opaque portions corresponds to the photoresist complete removal region to be formed. One of the first transmittance exposure portions corresponds to the third photoresist reserved portion to be formed. One of the second transmittance exposure portion corresponds to the second the photoresist reserved portion to be formed.

Figure 5:
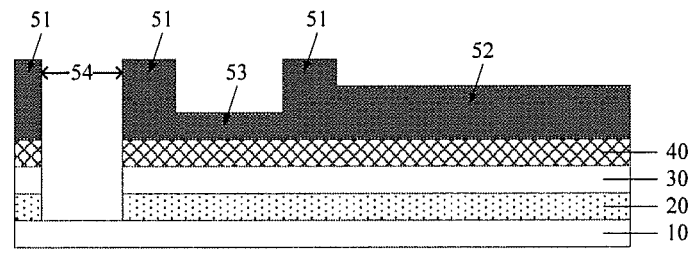
FIG. 5 is a schematic partial diagram of a third stepwise structure corresponding to a method for manufacturing an array substrate provided in some specific embodiments of the present disclosure.

In step 13 (S13), as shown in FIG. 5, portions of the second conductive layer 40 corresponding to the photoresist complete removal regions 54, and portions of the first conductive layer 30 and portions of the metal-oxide semiconductor layer 20 under the portions of the second conductive layer are removed in an etching process (i.e. a first etching), to form a rough region of the source drain pattern layer.

Figure 6:
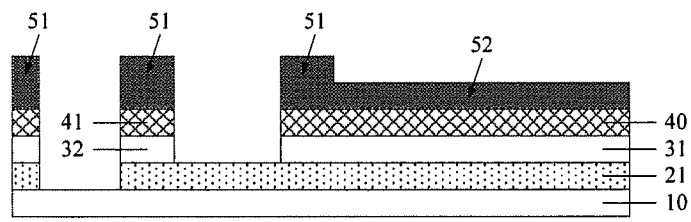
FIG. 6 is a schematic partial diagram of a fourth stepwise structure corresponding to a method for manufacturing an array substrate provided in some specific embodiments of the present disclosure.

In step 14 (S14), as shown in FIG. 6, the third photoresist reserved portions are removed in an ashing process (i.e. a first ashing), and correspondingly, thicknesses of the remaining reserved portions are also somewhat reduced. Further, portions of the second conductive layer 40 corresponding to the third photoresist reserved portions and portions of the first conductive layer 30 under the portions of the second conductive layer are removed in an etching process (i.e. a second etching), to form an active layer 21, a reserved pattern 32 of the first conductive layer located on the active layer 21, pixel electrodes 31 provided in a same layer as the reserved pattern 32 of the first conductive layer, source electrodes 41 and data lines 43 (not shown in FIG. 6 and shown in FIG. 10).

Figure 7:
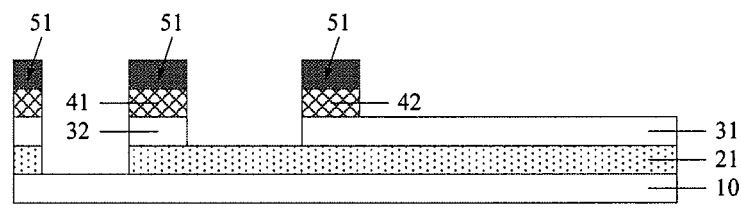
FIG. 7 is a schematic partial diagram of a fifth stepwise structure corresponding to a method for manufacturing an array substrate provided in some specific embodiments of the present disclosure.

In step 15 (S15), as shown in FIG. 7, the second photoresist reserved portions are removed in an ashing process (i.e. a second ashing), and correspondingly, thicknesses of the remaining reserved portions are also somewhat reduced. Further, portions of the second conductive layer corresponding to the second photoresist reserved portions are removed in an etching process (i.e. a third etching) to form drain electrodes 42.

Figure 8:
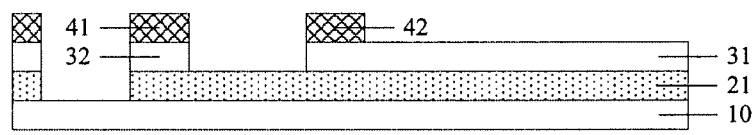
FIG. 8 is a schematic partial diagram of a sixth stepwise structure corresponding to a method for manufacturing an array substrate provided in some specific embodiments of the present disclosure.

In step 16 (S16), as shown in FIG. 8, the first photoresist reserved portions are removed in a lift-off process to expose the formed source drain pattern layer, the pixel electrodes 31 and regions (i.e. channel regions when TFTs are switched on) of the active layer 21 corresponding to regions each of which is located between the source electrode 41 and the drain electrode 42.

Figure 9:
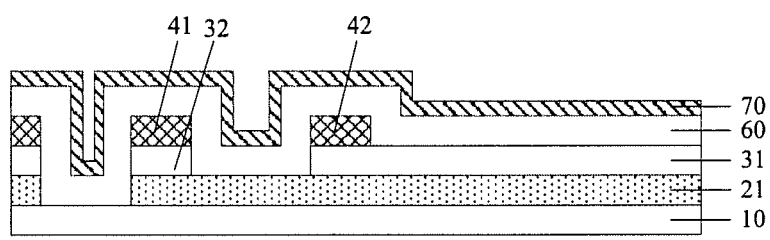
FIG. 9 is a schematic partial diagram of a seventh stepwise structure corresponding to a method for manufacturing an array substrate provided in some specific embodiments of the present disclosure.

In step 17 (S17), as shown in FIG. 9, a gate insulating layer 60 and a second gate conductive layer 70 that cover the active layer 21, the pixel electrodes 31 and the source drain pattern layer are formed sequentially.

Figure 10:
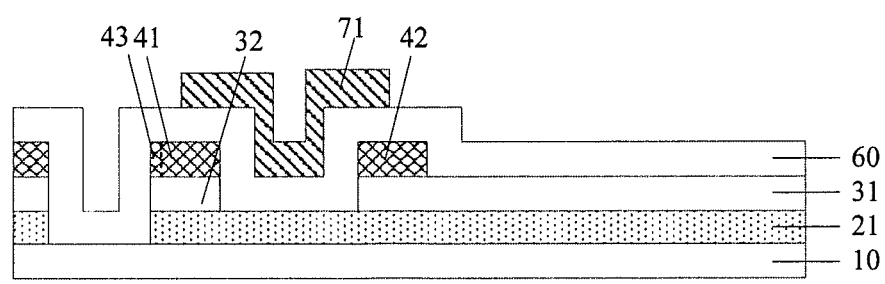
FIG. 10 is a schematic partial diagram of an eighth stepwise structure corresponding to a method for manufacturing an array substrate provided in some specific embodiments of the present disclosure.

In step 18 (S18), as shown in FIG. 10, a gate metal pattern layer is formed on the gate insulating layer 60 in a patterning process. The gate metal pattern layer includes gate electrodes 71 and gate lines (not shown in FIG. 10).

The above embodiments are merely the specific embodiments of the present disclosure, but the scope of the present disclosure is not limited thereto. For those skilled in the art, various changes and modifications can be made therein without departing from the spirit and essence of the disclosure, which are also considered to be within the scope of the disclosure. Therefore, the protection scope of the present disclosure should be determined by the protection scope of the claims.

What is claimed is:

1. A method for manufacturing an array substrate, the method comprising:
   forming a metal-oxide semiconductor layer, a first conductive layer and a second conductive layer sequentially on a substrate; and
   treating the metal-oxide semiconductor layer, the first conductive layer and the second conductive layer in a single patterning process using a mask, to form an active layer, pixel electrodes, a source drain pattern layer which comprises source electrodes, drain electrodes and data lines, and a reserved pattern of the first conductive layer which is provided in a same layer as the pixel electrodes and formed on sides of the source electrodes and the data lines close to the active layer, wherein,
   a drain electrode of the drain electrodes is in direct contact with a corresponding pixel electrode of the pixel electrodes, and a partial region of the pixel electrode is unobstructed from the drain electrode.

2. The method according to claim 1, wherein the mask comprises totally transparent portions, opaque portions, first transmittance exposure portions and second transmittance exposure portions; transmittances of the first transmittance exposure portions and the second transmittance exposure portions are different, and are less than a transmittance of the totally transparent portions;
   during the patterning process for treating the metal-oxide semiconductor layer, the first conductive layer and the second conductive layer, one of the first transmittance exposure portions corresponds to a region of an active layer to be formed corresponding to a region between a source electrode and a drain electrode in the source drain pattern layer, and one of the second transmittance exposure portions corresponds to a partial region of a pixel electrode to be formed unobstructed from a corresponding drain electrode in the source drain pattern layer.

3. The method according to claim 2, wherein treating the metal-oxide semiconductor layer, the first conductive layer and the second conductive layer in the single patterning process using the mask to form the active layer, the pixel electrodes, and the source drain pattern layer comprises:
   forming a photoresist layer covering the second conductive layer;
   performing a treatment comprising exposure and development for the photoresist layer via the mask, to form first photoresist reserved portions, second photoresist reserved portions, third photoresist reserved portions and photoresist complete removal regions, wherein thicknesses of each first photoresist reserved portion, each second photoresist reserved portion and each third photoresist reserved portion are successively decreased, the first photoresist reserved portions correspond to a source drain pattern layer to be formed, one of the second photoresist reserved portions corresponds to the partial region of the pixel electrode to be formed unobstructed from the corresponding drain electrode in the source drain pattern layer, one of the third photoresist reserved portions corresponds to the region of the active layer to be formed corresponding to the region between the source electrode and the drain electrode in the source drain pattern layer, and the photoresist complete removal regions correspond to remaining regions of the second conductive layer;
   removing portions of the second conductive layer corresponding to the photoresist complete removal regions, and portions of the first conductive layer and portions of the metal-oxide semiconductor layer which are under the portions of the second conductive layer corresponding to the photoresist complete removal regions;
   sequentially removing the third photoresist reserved portions, portions of the second conductive layer corresponding to the third photoresist reserved portions, and portions of the first conductive layer under the portions of the second conductive layer corresponding to the third photoresist reserved portions, to form an active layer, a reserved pattern of the first conductive layer that is located on the active layer, and pixel electrodes, source electrodes and data lines that are provided in a same layer as the reserved pattern of the first conductive layer;
   sequentially removing the second photoresist reserved portions and portions of the second conductive layer corresponding to the second photoresist reserved portions to form drain electrodes; and
   removing the first photoresist reserved portions to expose the source drain pattern layer, the pixel electrodes and regions of the active layer corresponding to regions each of which is located between the source electrode and the drain electrode.

4. The method according to claim 3, wherein
   the photoresist layer is made of a positive photoresist material,
   a transmittance of the first transmittance exposure portions is larger than a transmittance of the second transmittance exposure portions; one of the totally transparent portions corresponds to a photoresist complete removal region to be formed, one of the opaque portions corresponds to a first photoresist reserved portion to be formed, one of the first transmittance exposure portions corresponds to a third photoresist reserved portion to be formed, and one of the second transmittance exposure portions corresponds to a second photoresist reserved portion to be formed.

5. The method according to claim 3, wherein
   the photoresist layer is made of a negative photoresist material,
   a transmittance of the first transmittance exposure portions is less than a transmittance of the second transmittance exposure portions; one of the totally transparent portions corresponds to a first photoresist reserved portion to be formed, one of the opaque portions corresponds to a photoresist complete removal region to be formed, one of the first transmittance exposure portions corresponds to a third photoresist reserved portion to be formed, and one of the second transmittance exposure portions corresponds to a second photoresist reserved portion to be formed.

6. The method according to claim 1, wherein the method further comprises:
   forming a gate insulating layer which covers the active layer, the pixel electrodes and the source drain pattern layer; and
   forming a gate metal pattern layer on the gate insulating layer; and the gate metal pattern layer comprises gate electrodes.

7. The method according to claim 1, wherein the first conductive layer is a transparent conductive material layer.

8. The method according to claim 1, wherein the second conductive layer is a metal layer.

9. An array substrate, comprising a substrate, wherein the array substrate further comprises:

an active layer disposed on the substrate, wherein the active layer is made of a metal-oxide semiconductor;

a reserved pattern of a first conductive layer and pixel electrodes, wherein the reserved pattern and the pixel electrodes are disposed on the active layer; and a source drain pattern layer disposed above the active layer, wherein the source drain pattern layer comprises source electrodes, drain electrodes and data lines;

the source electrodes and the data lines cover the reserved pattern of the first conductive layer, and one of the drain electrodes covers a partial region of a corresponding one of the pixel electrodes.

10. The array substrate according to claim 9, wherein the array substrate further comprises a gate insulating layer covering the active layer, the pixel electrodes, the source drain pattern layer, and a gate metal pattern layer which is disposed on the gate insulating layer, and the gate metal pattern layer comprises gate electrodes and gate lines.

11. A display apparatus, comprising the array substrate according to claim 9.

\* \* \* \* \*